(12) United States Patent
Yaegashi

(10) Patent No.: US 8,735,966 B2
(45) Date of Patent: May 27, 2014

(54) NONVOLATILE SEMICONDUCTOR MEMORY DEVICE AND MANUFACTURING METHOD THEREOF

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/275,014

(22) Filed: Oct. 17, 2011

(65) Prior Publication Data

US 2012/0032251 A1 Feb. 9, 2012

Related U.S. Application Data

(63) Continuation of application No. 12/551,886, filed on Sep. 1, 2009, now Pat. No. 8,053,828.

(30) Foreign Application Priority Data

Mar. 13, 2009 (JP) .................................. 2009-060929

(51) Int. Cl.
*H01L 29/792* (2006.01)
(52) U.S. Cl.
USPC .................. 257/326; 257/324; 257/E21.409; 257/E29.309
(58) Field of Classification Search
USPC .................................. 257/324, 326; 438/261
See application file for complete search history.

(56) References Cited

U.S. PATENT DOCUMENTS

| | | | |
|---|---|---|---|
| 6,835,987 B2 | 12/2004 | Yaegashi | |
| 6,949,794 B2 | 9/2005 | Yaegashi | |
| 7,122,869 B2 | 10/2006 | Yaegashi | |
| 7,274,075 B2 | 9/2007 | Yaegashi | |
| 7,737,508 B2 | 6/2010 | Yaegashi | |
| 7,936,005 B2 | 5/2011 | Okamura | |
| 2005/0012142 A1* | 1/2005 | Hazama et al. | ............... 257/326 |
| 2005/0104120 A1 | 5/2005 | Ichige et al. | ................. 257/315 |

(Continued)

FOREIGN PATENT DOCUMENTS

| | | |
|---|---|---|
| JP | 2001-284554 | 10/2001 |
| JP | 2005-235260 | 9/2005 |
| JP | 2005-286168 | 10/2005 |
| JP | 2008-147664 | 6/2008 |

OTHER PUBLICATIONS

Sim et al. ("Sim") "Self Aligned Trap-Shallow Trench Isolation Scheme for the Reliability of TANOS (TaN/AlO/SiN/Oxide/Si) NAND Flash Memory" IEEE (Aug. 2007, pp. 110-111).*

(Continued)

Primary Examiner — A. Sefer
(74) Attorney, Agent, or Firm — Oblon, Spivak, McClelland, Maier & Neustadt, L.L.P.

(57) ABSTRACT

First and second memory cells have first and second channels, first and second tunnel insulating films, first and second charge storage layers formed of an insulating film, first and second block insulating films, and first and second gate electrodes. A first select transistor has a third channel, a first gate insulating film, and a first gate electrode. The first channel includes a first-conductivity-type region and a second-conductivity-type region which is formed on at least a part of the first-conductivity-type region and whose conductivity type is opposite to the first conductivity type. The third channel includes the first-conductivity-type region and the second-conductivity-type region formed on the first-conductivity-type region. The number of data stored in the first memory cell is smaller than that of data stored in the second memory cell.

12 Claims, 14 Drawing Sheets

(56) References Cited

U.S. PATENT DOCUMENTS

| | | | |
|---|---|---|---|
| 2005/0227426 A1* | 10/2005 | Deppe et al. | 438/201 |
| 2006/0202263 A1* | 9/2006 | Lee | 257/330 |
| 2006/0240623 A1* | 10/2006 | Lee et al. | 438/257 |
| 2007/0284651 A1* | 12/2007 | Sim et al. | 257/324 |
| 2009/0121275 A1* | 5/2009 | Kim et al. | 257/321 |
| 2009/0212340 A1* | 8/2009 | Lee et al. | 257/315 |
| 2009/0238002 A1 | 9/2009 | Wong et al. | 365/185.17 |
| 2009/0256192 A1* | 10/2009 | Fujitsuka et al. | 257/324 |
| 2010/0038704 A1* | 2/2010 | Yaegashi | 257/326 |
| 2011/0014758 A1* | 1/2011 | Joo et al. | 438/259 |
| 2011/0233650 A1* | 9/2011 | Park et al. | 257/324 |

OTHER PUBLICATIONS

Jae-Duk Lee, et al., "A New Programming Disturbance Phenomenon in NAND Flash Memory by Source/Drain Hot-Electrons Generated by GIDL Current", 2006 IEEE, pp. 31-33.

Office Action issued Apr. 16, 2013 in Japanese patent Application No. 2009-060929 (with English translation).

* cited by examiner

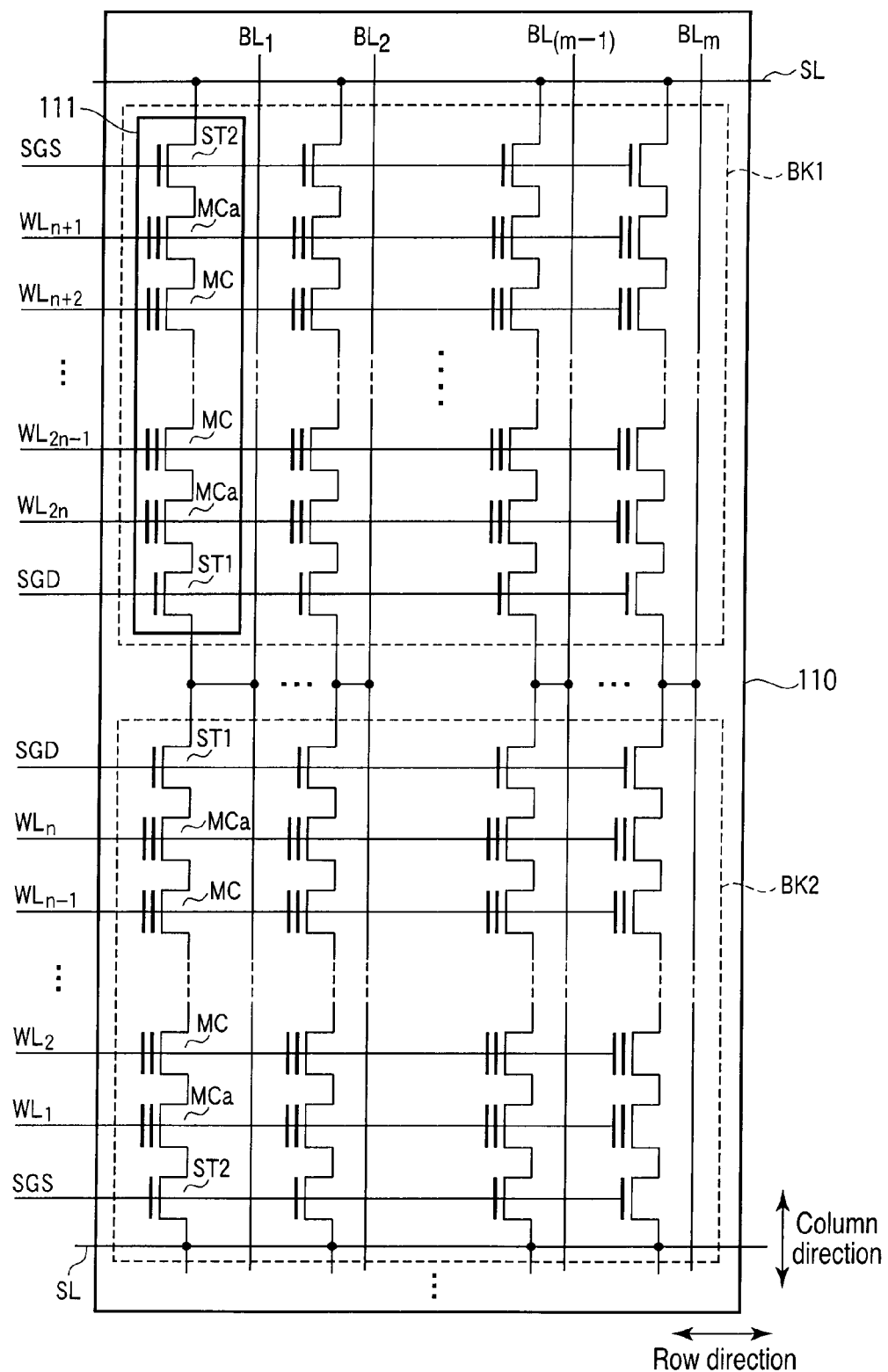
F I G. 1

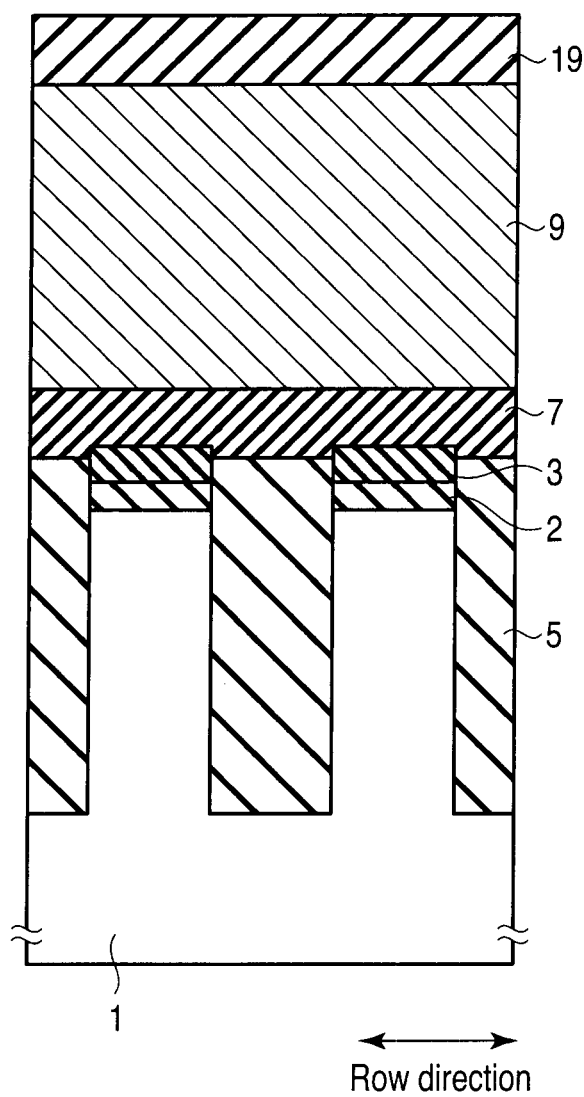
F I G. 4

NONVOLATILE SEMICONDUCTOR MEMORY DEVICE AND MANUFACTURING METHOD THEREOF

CROSS-REFERENCE TO RELATED APPLICATIONS

This application is a continuation of U.S. patent application Ser. No. 12/551,886, filed on Sep. 1, 2009. It is also based upon, and claims the benefit of priority from, prior Japanese Patent Application No. 2009-060929, filed Mar. 13, 2009, the entire contents of each of which are incorporated herein by reference.

BACKGROUND OF THE INVENTION

1. Field of the Invention

The present invention relates to a nonvolatile semiconductor memory device, and more particularly to a nonvolatile semiconductor memory device which is used for a NAND flash memory.

2. Description of the Related Art

A NAND flash memory as a nonvolatile semiconductor memory device is developed. Demand for NAND flash memories is rising with an increase in applications using bulk data, e.g., images or moving images in a mobile device or the like. With each generation of NAND flash memory, the memory cell size has shrunk to increase memory capacity.

A memory cell adjacent to a select transistor has a surrounding potential relationship different from that of a memory cell that is not adjacent to a select transistor. Therefore, there is a problem that the characteristics of memory cells fluctuate. To solve this problem, data stored in a memory cell adjacent to a select transistor is reduced to be smaller than data stored in a memory cell which is not adjacent to a select transistor.

However, even though the above-described configuration is adopted, hot electrons caused by a gate-induced drain leakage (GIDL) current produced in source/drain regions of a select transistor at the time of, e.g., a write operation are injected into a memory cell which is adjacent to the select transistor. As a result, there arises a problem that programming error may occur in the memory cell, leading to operation error (see, e.g., "A New Programming Disturbance Phenomenon in NAND Flash Memory by Source/Drain Hot Electrons Generated by GIDL Current" J. D. Lee et al. pp. 31-33 NVSMW 2006).

BRIEF SUMMARY OF THE INVENTION

According to a first aspect of the invention, there is provided a nonvolatile semiconductor memory device comprising: a semiconductor substrate; first and second memory cells formed on the semiconductor substrate; and a first select transistor which is formed on the semiconductor substrate and is adjacent to the first memory cell in a first direction, wherein the first and second memory cells have: first and second channels formed near a surface of the semiconductor substrate; first and second tunnel insulating films formed on the first and second channels; first and second charge storage layers which are formed on the first and second tunnel insulating films and made of an insulating film; first and second block insulating films formed on the first and second charge storage layers; and first and second gate electrodes formed on the first and second block insulating films, respectively, the first select transistor has a third channel formed near the surface of the semiconductor substrate, a first gate insulating film formed on the third channel, and a first gate electrode formed on the first gate insulating film, the first channel includes a first-conductivity-type region and a second-conductivity-type region which is formed on at least a part of the first-conductivity-type region and whose conductivity type is opposite to the first conductivity type, the third channel is includes the first-conductivity-type region and the second-conductivity-type region formed on the first-conductivity-type region, and the number of data stored in the first memory cell is smaller than that of data stored in the second memory cell.

According to a second aspect of the invention, there is provided A manufacturing method of a nonvolatile semiconductor memory device comprising: forming a first-conductivity-type region in a semiconductor by injecting impurity ions having a first conductivity type into the semiconductor substrate; forming a second-conductivity-type region on a part of the first-conductivity-type region by injecting impurity ions having a second conductivity type which is opposite to the first conductivity type into the semiconductor substrate; and forming a first memory cell, a second memory cell, and a select transistor which is adjacent to the first memory cell in a first direction on the semiconductor substrate, wherein the first and second memory cells have: first and second channels formed near a surface of the semiconductor substrate; first and second tunnel insulating films formed on the first and second channels; first and second charge storage layers which are formed on the first and second tunnel insulating films and made of an insulating film; first and second block insulating films formed on the first and second charge storage layers; and first and second gate electrodes formed on the first and second block insulating films, respectively, the first select transistor has a third channel formed near the surface of the semiconductor substrate, a first gate insulating film formed on the third channel, and a first gate electrode formed on the first gate insulating film, the first channel includes a first-conductivity-type region and a second-conductivity-type region which is formed on at least a part of the first-conductivity-type region and whose conductivity type is opposite to the first conductivity type, the third channel is includes the first-conductivity-type region and the second-conductivity-type region formed on the first-conductivity-type region, and the number of data stored in the first memory cell is smaller than that of data stored in the second memory cell.

BRIEF DESCRIPTION OF THE SEVERAL VIEWS OF THE DRAWING

FIG. 1 is an equivalent circuit diagram of a cell array region according to a first embodiment;

FIG. 4 is a cross-sectional view taken along line IV-IV' in FIG. 2;

DETAILED DESCRIPTION OF THE INVENTION

An embodiment according to the present invention will now be described hereinafter in detail with reference to the accompanying drawings.

In an embodiment according to the present invention, a channel of a select transistor is formed in such a manner that an upper surface of a p-type region becomes an n-type one. Further, a channel of a memory cell that is adjacent to the select transistor is formed in such a manner that part or all of an upper surface of a p-type region becomes an n-type one.

Furthermore, a memory cell that is adjacent to the select transistor is controlled in such a manner that the number of data becomes zero (a dummy cell) or smaller than that of data stored in a memory cell that is not adjacent to the select transistor.

As a result, a GIDL current that is produced near an end portion of a gate electrode of the memory cell that is adjacent to the select transistor can be suppressed in a write operation.

On the other hand, although the channel length of a memory cell is reduced as the memory cell is shrunk, the channel length of the select transistor cannot be reduced because a punch-through breakdown voltage must be set to a fixed value or higher value. Therefore, the difference between the channel length of the memory cell and the channel length of the select transistor tends to increase.

In particular, a high-k film that is used as a block film of a memory cell is sometimes used as a part of a gate insulating film of the select transistor in a MONOS memory cell. In this case, a neutral threshold voltage of the select transistor becomes too high because of the influence of a fixed charge of the high-k film. Therefore, there is a problem that the on-current of the select transistor is reduced.

To solve this problem, an n-type region is formed on an upper surface of a channel of a p-type select transistor. As a result, the neutral threshold voltage of the select transistor is reduced. Therefore, there are provided characteristics that the punch-through breakdown voltage and cutoff characteristics between source and drain regions are not degraded even though the channel length of the select transistor is reduced.

(1) First Embodiment

A first embodiment will now be described hereinafter with reference to the accompanying drawings while taking a NAND flash memory as an example.

Figure 2:
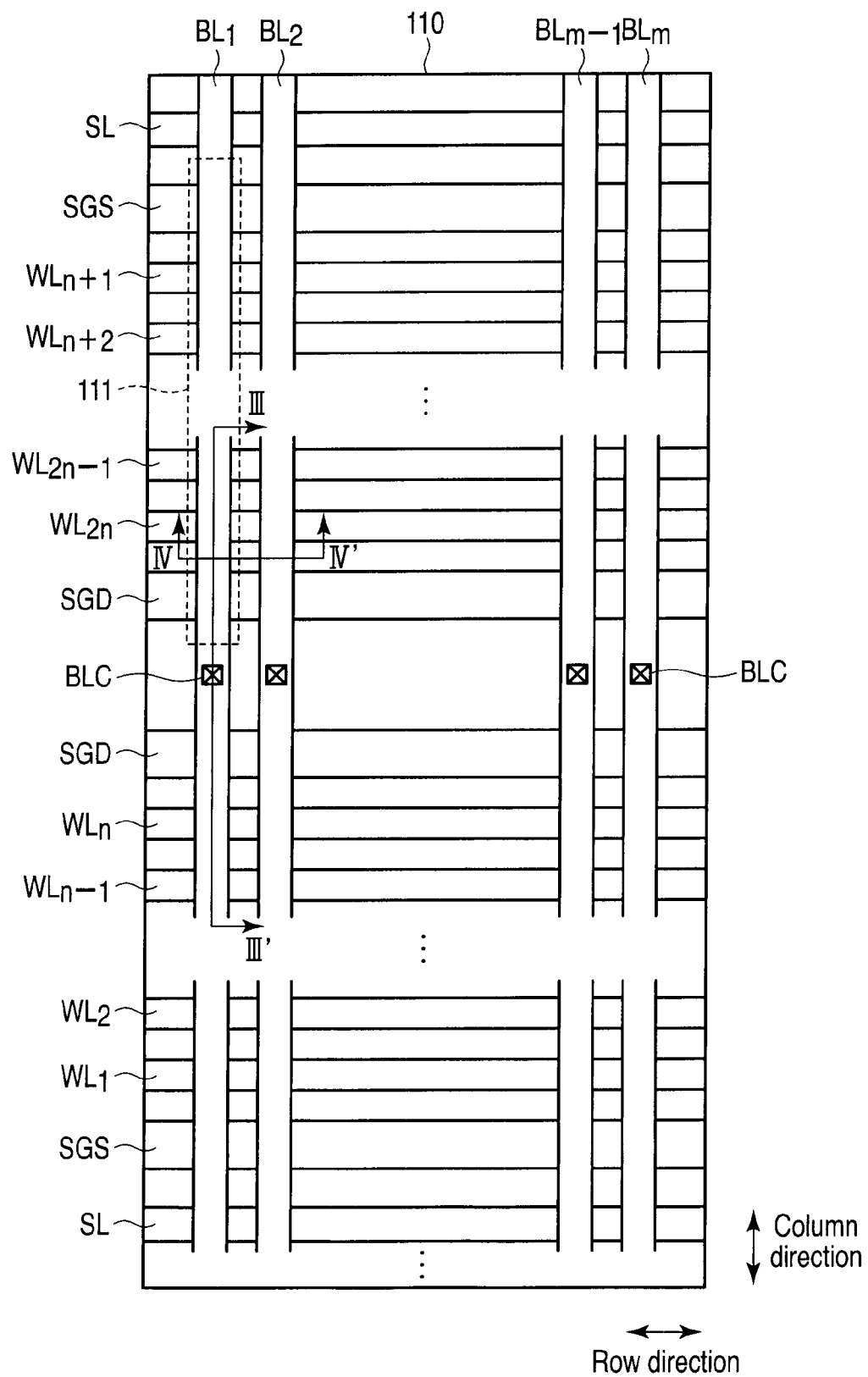
FIG. 2 is a plan view of the cell array region according to the first embodiment.

A configuration of the NAND flash memory will be explained in conjunction with FIGS. 1 and 2. FIG. 1 is an equivalent circuit diagram of a cell array region of the NAND flash memory. FIG. 2 is a plan view of the cell array region of the NAND flash memory.

As shown in FIG. 1, a cell array region 110 has a plurality of blocks BK1, BK2, . . . , arranged in a column direction. Each of the plurality of blocks BK1, BK2, . . . , has a plurality of unit memory cells 111 arranged in a row direction.

Each of the plurality of unit memory cells 111 is constituted of an NAND string including a plurality of memory cells MC connected in series, and two select transistors ST1 and ST2 connected at both ends of this string, respectively.

One end of the unit memory cell 111 is connected with a bit line BL1, BL2, . . . or BLm connected with a non-illustrated sense amplifier, and the other end of the same is connected with a source line SL in common.

Moreover, in the unit memory cell 111, word lines WL associated with the number of the memory cells MC are arranged. Each word line WL is electrically connected to a gate electrode of the memory cell MC.

A control line SGD is electrically connected to a gate electrode of the select transistor ST1.

Further, a control line SGS is electrically connected to a gate electrode of the select transistor ST2.

Each memory cell MCa which is adjacent to the select transistor functions as a dummy cell that does not store data therein or a memory cell MCa that the number of data stored therein is smaller than that of data in the memory cell MC which is not adjacent to the select transistor.

As shown in FIG. 2, in the cell array region 110, the source lines SL, the control lines SGS and SGD, and the word lines WL are arranged parallel to be apart from each other in the column direction. Additionally, the bit lines BL are arranged parallel to be apart from each other in the row direction, respectively. Element regions are formed below the bit lines BL, and each element isolation region is provided between these element regions. That is, a semiconductor substrate is divided into the plurality of element regions by the element isolation regions.

The memory cell MC is arranged at each intersecting point of the word line WL and the bit line BL, and the select transistor is formed at an intersecting point of the bit line BL and the select gate line SGS or SGD.

Further, a bit line contact BLC is provided between the two select gate lines SGD. This bit line contact BLC connects the bit line BL to the other end of the unit memory cell 111.

Figure 3:
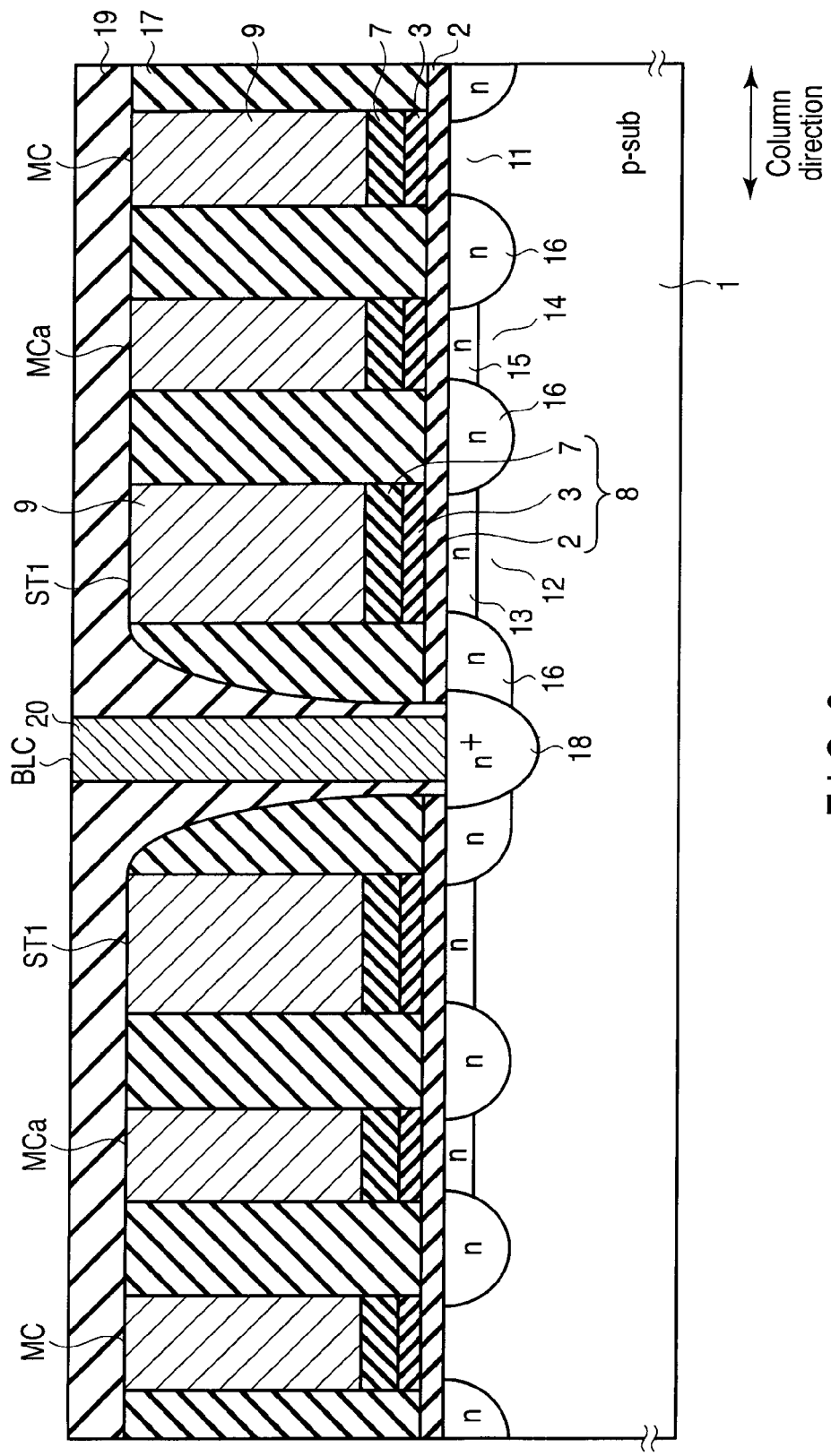
FIG. 3 is a cross-sectional view taken along line III-III' in FIG. 2.

FIG. 3 is a cross-sectional view taken along line III-III' in FIG. 2. FIG. 4 is a cross-sectional view taken along line IV-IV' in FIG. 2. Furthermore, giving a description with reference to a cross-sectional view of a bit line contact side, a source line side has the same configuration.

As shown in FIG. 3, a channel of the memory cell MC is formed in a region close to the surface of a p-type semiconductor substrate 1. Moreover, a tunnel insulating film 2 is formed on the channel, and a charge storage layer 3 consisting of an insulating film is formed on this tunnel insulating film. A block insulating film 7 is formed on this charge storage layer 3, and a gate electrode 9 is formed on this block insulating film. In contrast, in the select transistor ST1, a gate insulating film 8 is formed on the p-type semiconductor substrate 1, and the gate electrode 9 is formed on the gate insulating film 8.

Here, "channel" does not mean an "inversion layer" itself. The channel is a region near the surface of the semiconductor substrate 1 below the gate insulating film 8, and it means a region including the inversion layer formed by using a voltage applied to the gate electrode 9. That is, "channel" does not mean the inversion layer alone, but a region sandwiched between source and drain regions 16.

Additionally, the memory cell MCa which is adjacent to the select transistor ST1 has substantially the same configuration as the memory cell MC, but has a different impurity structure of the channel.

Further, in the first embodiment, the select transistor ST1 has substantially the same configuration as the memory cell MC. That is, in the select transistor ST1, the channel is formed near the upper surface of the p-type semiconductor substrate 1, and the gate insulating film 8 and the gate electrode 9 are formed on this channel. The gate insulating film 8 has a configuration in which the tunnel insulating film 2, the charge storage layer 3, and the block insulating film 7 of the memory cell MC are laminated.

An insulating film 17 is formed on a side surface of the gate electrode 9. An insulating film 19 in which a contact hole is opened is formed on this insulating film 17. A contact plug 20 which serves as a bit line contact BLC is formed in this contact hole.

The channel of the select transistor ST1 is constituted of a p-type region 12 and an n-type region 13 formed on an upper surface of the p-type region 12. Here, an impurity concentration of the n-type region 13 is adjusted in such a manner that the channel is not formed (the transistor is not turned on) when the potential in the gate electrode 9 of the select transistor ST1 formed in a MONOS type is zero. That is, the select transistor ST1 is an enhanced (E-type) transistor having a buried channel. This structure may be realized by providing the select transistor ST1 with the block insulating film 7 having many fixed charges and the gate electrode 9 having a high work function.

The channel of the memory cell MCa which is adjacent to the select transistor ST1 is constituted of a p-type region 14 and an n-type region 15 which is formed on an upper surface of the p-type region 14 like the channel of the select transistor ST1. Here, the memory cell MCa has the buried channel, but either the E- or a D-type may be used for the memory cell MCa. That is because, in a programming operation, the select transistor ST1 must cut off the non-selected unit memory cell 111 whereas the memory cell MCa does not have to cut off the same.

Furthermore, n-type source/drain regions 16 are formed between the channels of the memory cells MC and MCa and the select transistor ST1. Moreover, an n$^+$-type diffusion layer 18 having a higher impurity concentration than that of the n-type source/drain regions 16 is formed immediately below the bit line contact BLC.

The memory cell MCa which is adjacent to the select transistor ST1 is controlled in such a manner the number of data stored therein becomes smaller than that of data stored in the memory cell MC which is not adjacent to the select transistor ST1. It is assumed that the number of data stored in the memory cell MCa includes a data number 0 (e.g., a dummy cell).

That is, when the memory cell MC stores multi-valued (higher than a binary) data, the memory cell MCa is controlled as a dummy cell or to store binary data therein, for example. Additionally, when the memory cell MC stores binary data, the memory cell MCa is controlled to function as the dummy cell, for example.

As shown in FIG. 4, element isolation insulating films 5 each having a shallow trench isolation (STI) structure are formed in the p-type semiconductor substrate 1. The element isolation insulating films 5 are formed into a long stripe shape extending in the column direction to separate the memory cells MC aligned in the row direction from each other.

The tunnel insulating film 2 and the charge storage layer 3 are formed on the p-type semiconductor substrate 1 sandwiched between the element isolation insulating films 5. Here, each element isolation insulating film 5 is formed in such a manner that an upper surface thereof becomes lower than an upper surface of the charge storage layer 3. The block insulating film 7 is formed on the charge storage layer 3 and the element isolation insulating film 5. The gate electrode 9 is formed on this block insulating film 7.

According to the first embodiment, the channel of the select transistor ST1 or of the memory cell MCa which is adjacent to the select transistor ST1 is constituted of the p-type region 12 or 14 and the n-type region 13 or 15 formed on the upper surface of the p-type region 12 or 14. The tunnel insulating film 2 is formed on this n-type region 13 or 15. In contrast, the channel of the memory cell region MC which is not adjacent to the select transistor ST1 is formed of the p-type region 11 alone.

Therefore, the p-type region 12 or 14 formed in the channel of the select transistor or the memory cell MCa is formed in a region apart from an interface of the tunnel insulating film 2. As a result, in the programming operation, a GIDL current which is occurred near a gate end of the select transistor ST1 and near an end of the charge storage layer 3 of the memory cell MCa can be suppressed.

Further, the n-type region 13 is formed near the upper surface of the channel of the select transistor ST1. As a result, a neutral threshold voltage of the select transistor ST1 is reduced. Consequently, it is possible to prevent the on-current reducing of the select transistor ST1.

It should be noted that, when the memory cell MCa is used as, e.g., a dummy cell, the dummy cell can be turned on when reading data in the other memory cells MC. Therefore, a neutral threshold voltage of the dummy cell must be kept low.

The n-type region 15 is formed near the upper surface of the channel of the memory cell MCa. As a result, a neutral threshold voltage of the memory cell MCa which is adjacent to the select transistor ST1 becomes lower than that of the memory cell MC which is not adjacent to the select transistor ST1. Consequently, in a read operation, a voltage applied to the gate voltage 9 of the memory cell MCa can be reduced to be lower than a voltage applied to the gate electrode 9 of the memory cell MC. That is, in the memory cell MCa, a read stress which is caused when reading data is reduced, thereby avoiding an operation error in the read operation.

Moreover, the present invention has characteristics that a punch-through breakdown voltage and cutoff characteristics between the source/drain regions 16 are not degraded even though a channel length of the select transistor ST1 is reduced.

Additionally, the n-type regions 13 and 15 formed in the channels of the select transistor ST1 and the memory cell MCa can be formed based on implantation of the same impurity ions. As a result, the n-type regions 13 and 15 formed in the respective channels can be obtained by the single-ion implantation process. Therefore, the manufacturing cost can be reduced.

(2) Second Embodiment

A second embodiment will now be described hereinafter with reference to the accompanying drawings while taking a NAND flash memory as an example. It should be noted that, in this embodiment, a description of parts the same as those in the first embodiment will be omitted, and different parts will be explained.

Figure 5:
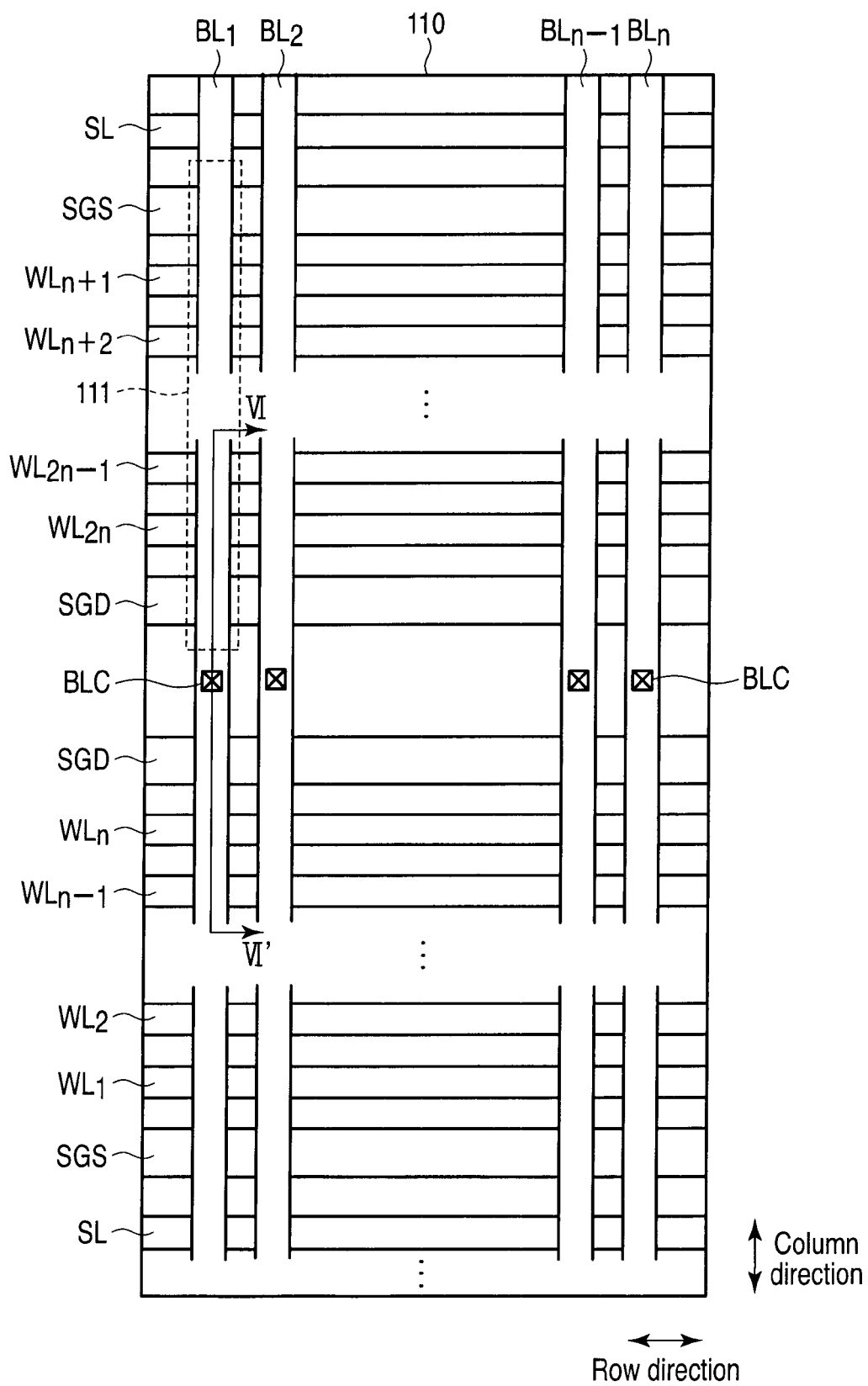
FIG. 5 is a plan view of a cell array region according to a second embodiment.

FIG. 5 is a plan view of a cell array region of the NAND flash memory.

As shown in FIG. 5, a configuration of a cell array region 110 of the NAND flash memory is the same as that in the first embodiment.

Figure 6:
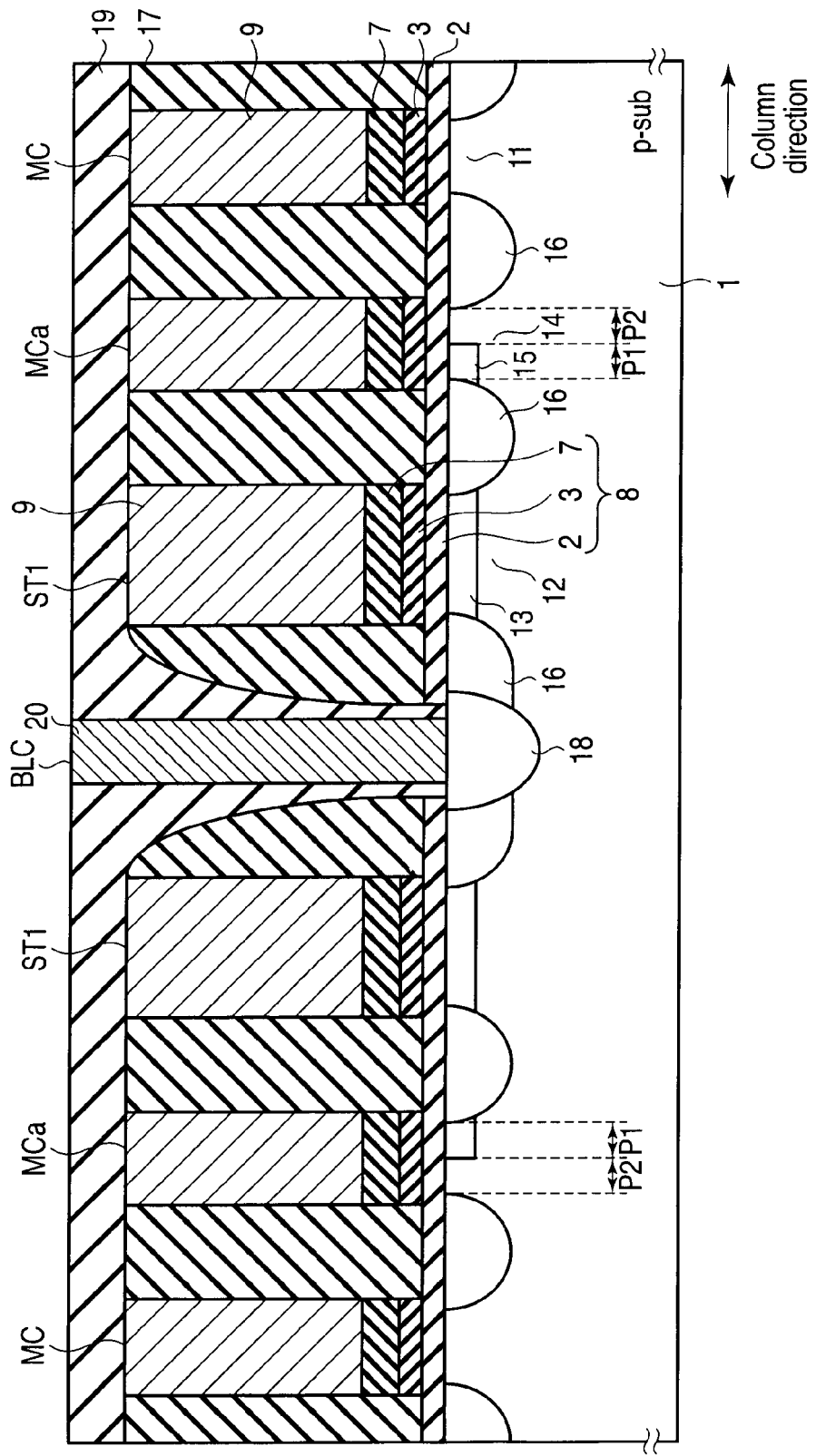
FIG. 6 is a cross-sectional view taken along line VI-VI' in FIG. 5.

FIG. 6 is a cross-sectional view taken along line VI-VI' in FIG. 5.

As shown in FIG. 6, the second embodiment is different from the first embodiment in that an n-type region 15 is formed on a part of a p-type region 14 formed in a channel of a memory cell MC which is adjacent to a select transistor ST1.

That is, a channel of a memory cell MCa is constituted of a first portion P1 consisting of the p-type region 14 and the n-type region 15 formed on a part of an upper surface of the p-type region 14 and a second portion P2 consisting of the p-type region 14 alone. This first portion P1 is formed to be contact with a source/drain region 16 formed between the select transistor ST1 and the memory cell MCa.

It should be noted that a boundary between the first portion P1 and the second portion P2 can be placed in any position in the channel of the memory cell MCa.

According to the second embodiment, the same effects as those of the first embodiment can be obtained.

Furthermore, according to this embodiment, the channel of the memory cell MCa which is adjacent to the select transistor ST1 is constituted of the p-type region 14 and the n-type region 15 formed on a part of the upper surface of the p-type region 14. That is, it is sufficient for the n-type region 15 to be formed on a part of the upper surface of the p-type region 14. As a result, as compared with the first embodiment, a lithography matching margin when forming an n-type diffusion layer 13 can be improved. Therefore, this embodiment has characteristics that a new space considering the lithography matching margin does not have to be assured.

(3) Modification

A modification of the first embodiment and the second embodiment will now be described hereinafter.

Figure 7:
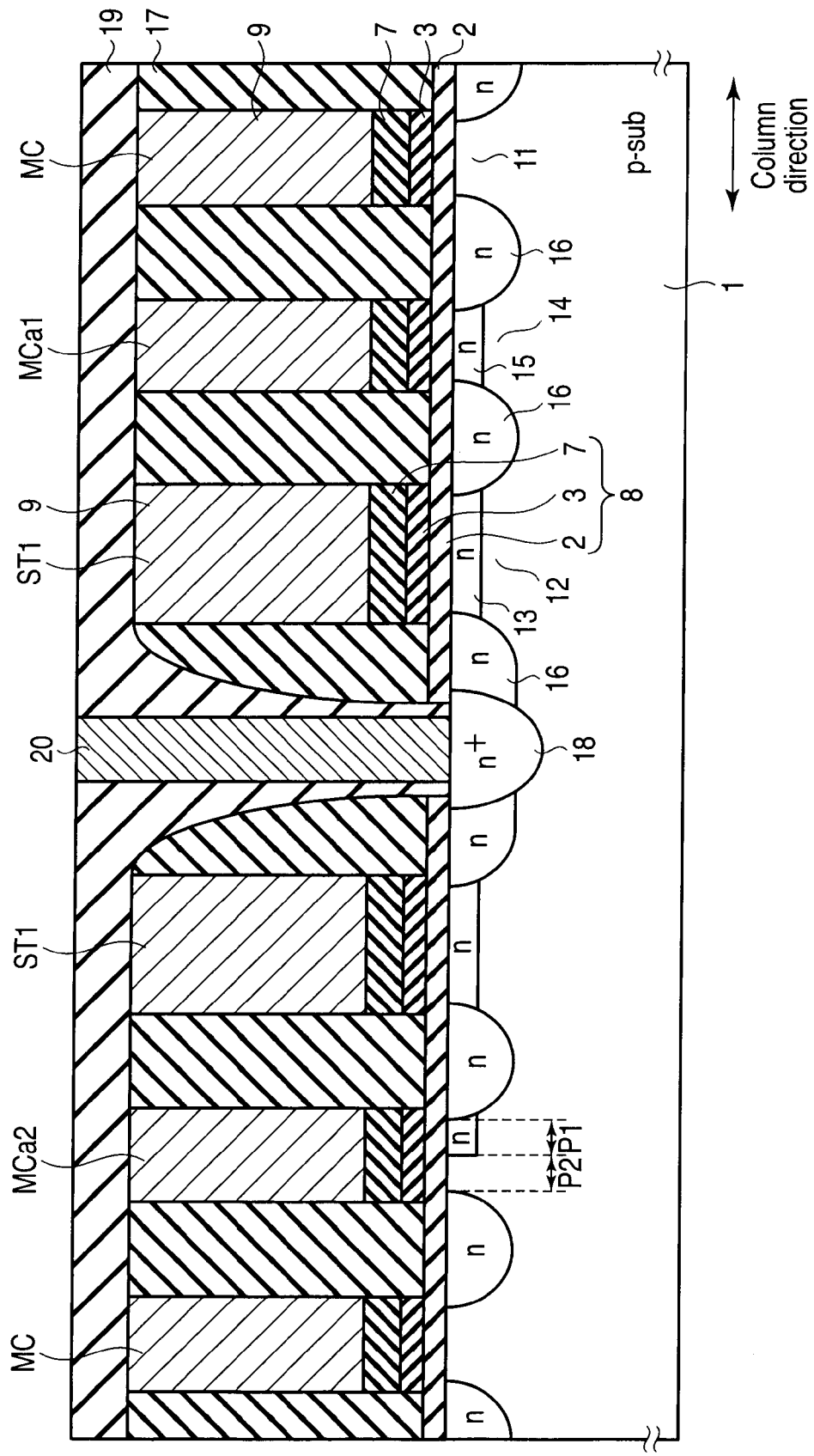
FIG. 7 is a cross-sectional view of a cell array region in a column direction showing a modification of the first and second embodiments.

FIG. 7 is a cross-sectional view of a memory cell in a NAND flash memory according to the modification in a channel length direction.

As shown in FIG. 7, in the modification, a channel of a memory cell MCa1 which is adjacent to one of two select transistors ST1 that is adjacent to a contact plug 20 is constituted of a p-type region 14 and an n-type region 15 formed on an upper surface of the p-type region 14. A channel of a memory cell MCa2 which is adjacent to the other select transistor ST1 is constituted of a first portion P1 consisting of the p-type region 14 and the n-type region 15 formed on the upper surface of the p-type region 14 and a second portion P2 consisting of the p-type region 14 alone. That is, the modification has a configuration obtained by combining the first and second embodiments.

Usually, n-type diffusion layers 13 formed in the memory cells MCa1 and MCa2 are simultaneously formed. That is, an opening is formed in a resist mask in a region between the memory cell MCa1 and the memory cell MCa2, and impurity ions are implanted from this opening, thereby forming the n-type diffusion layers 13, 15. Therefore, a lithography matching margin is increased to a value obtained by adding a matching margin between the memory cell MC and the memory cell MCa as well as a channel length of the memory cell MCa.

Forming the above-described configuration enables improving a lithography matching margin when forming each n-type diffusion layer 13, 15 as compared with the second embodiment. Therefore, this modification has characteristics that a new space considering a total displacement in matching does not have to be assured (4) Manufacturing Method A manufacturing method according to this embodiment will now be described hereinafter with reference to FIGS. 8 to 15 while taking a NAND flash memory as an example.

Figure 8:
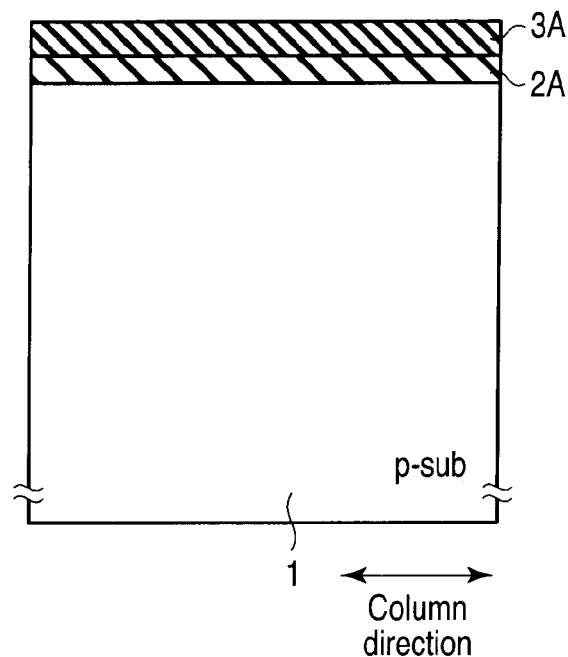
FIG. 8 is a cross-sectional view taken along line III-III' in FIG. 2.
Figure 9:
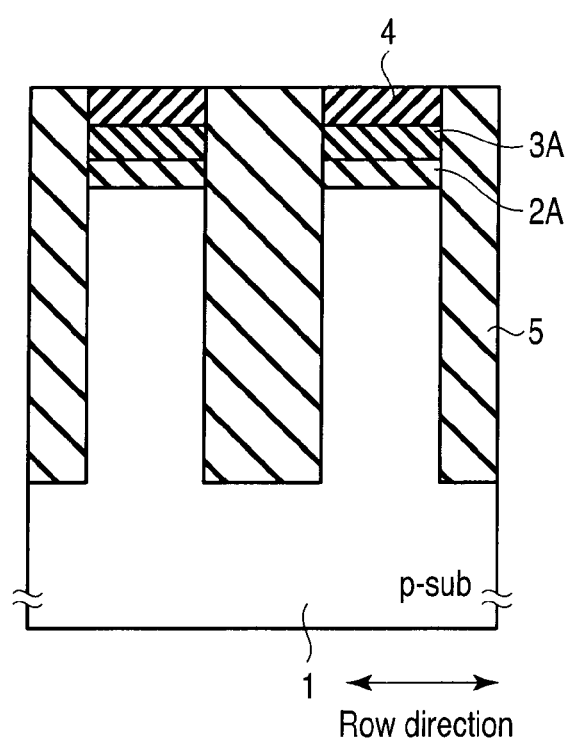
FIG. 9 is a cross-sectional view taken along line IV-IV' in FIG. 2.

FIG. 8 is a cross-sectional view taken along line III-III' in FIG. 2, and FIG. 9 is a cross-sectional view taken along line IV-IV' in FIG. 2.

Moreover, FIGS. 10 to 15 are cross-sectional views taken along line III-III' in FIG. 2.

As shown in FIG. 8, in a cell array region 110 in a p-type semiconductor substrate 1, n-/p-type double well regions are formed by ion implantation. Then, a p-type channel is formed on the surface of a p-type well by the ion implantation. It should be noted that the n-/p-type double well regions are omitted in FIGS. 8 to 15.

Then, for example, a tunnel insulating film material 2A of a memory cell MC is formed on the semiconductor substrate 1 by, e.g., a thermal oxidation method. Subsequently, a charge storage layer material 3A is formed on the tunnel insulating film material 2A by, e.g., chemical vapor deposition (CVD).

Here, the tunnel insulating film material 2A is formed of, e.g., a silicon oxide film, an oxide-nitride-oxide (ONO) film, or a band engineering film having an improved tunneling efficiency of a hole. Furthermore, the charge storage layer material 3A is formed of, e.g., a silicon nitride film.

Then, as shown in FIG. 9, a mask material formed of a laminated film including a silicon oxide film 4 and a silicon nitride film (not shown) is deposited on the charge storage layer material 3A. Thereafter, an element isolation region part in the mask material is opened by a lithography process, and the charge storage layer material 3A, the tunnel insulating film material 2A, and the p-type semiconductor substrate 1 are sequentially etched. As a result, each trench that serves as an element isolation region is formed in the p-type semiconductor substrate 1. Thereafter, the trench formed in the p-type semiconductor substrate 1 is filled with an element isolation insulating film 5 consisting of a silicon oxide film. Then, an entire surface is flattened by the chemical mechanical polishing (CMP) method. Subsequently, a height of each element isolation insulating film 5 is adjusted by etching, and then a silicon oxide film of the mask material is removed.

Figure 10:
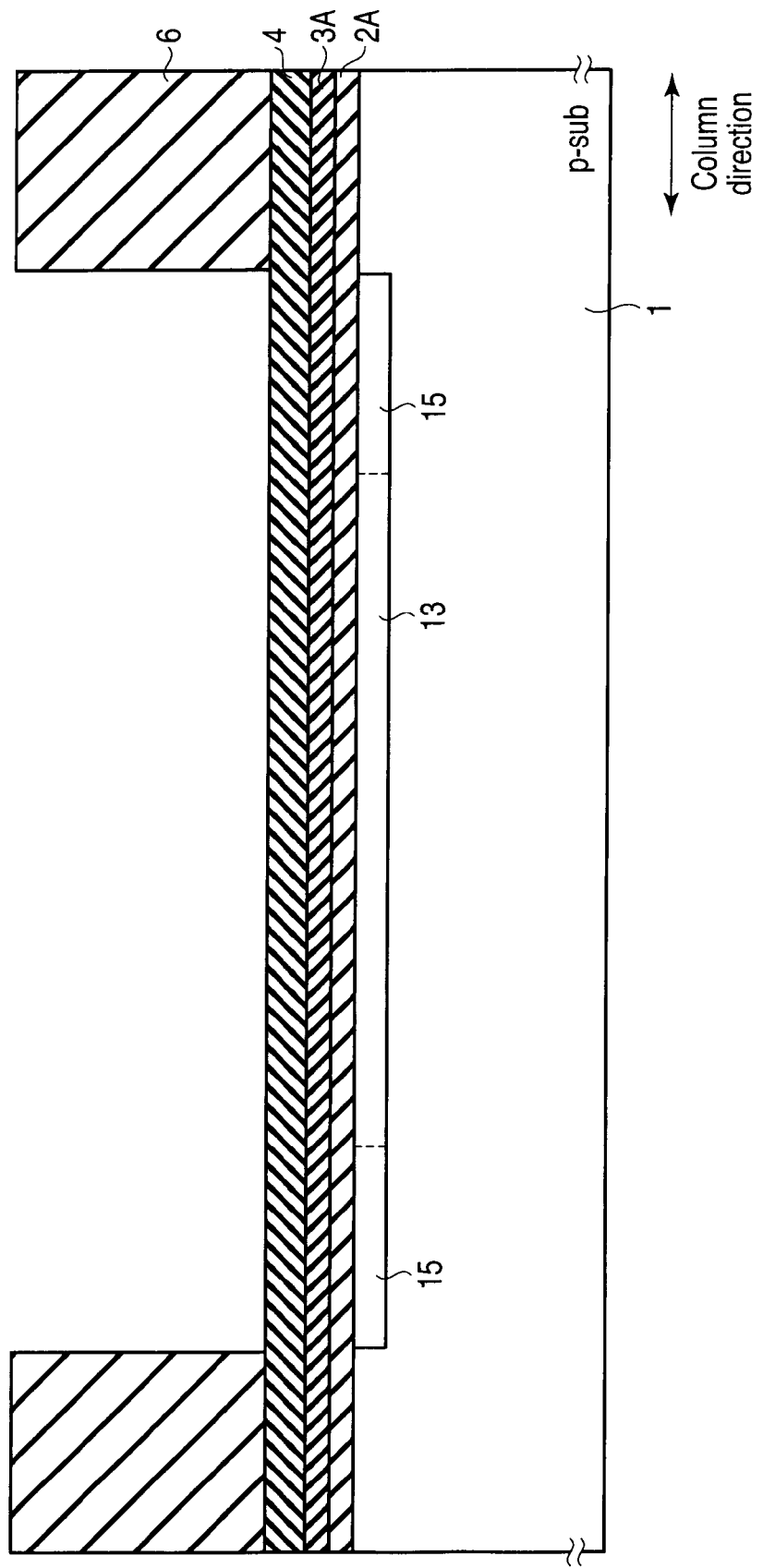
FIGS. 10 to 15 are cross-sectional views taken along line III-III' in FIG. 2.

As shown in FIG. 10, a resist 6 is deposited, and then the resist 6 is patterned in such a manner that regions that become channels of a select transistor ST1 and a memory cell MCa which is adjacent to the select transistor ST1 are opened. N-type impurity ions are implanted into the regions opened by this patterning. As a result, n-type regions 13 and 15 are formed in a region near an upper surface of the p-type semiconductor substrate 1. Consequently, the manufacturing cost can be reduced as compared with that in an example where the n-type regions 13 and 15 are formed by different lithography processes. Thereafter, the resist 6 and the silicon oxide film 4 in the mask material are removed.

It should be noted that the n-type region 13 may be formed before forming the tunnel insulating film material 2A. That is, in a final configuration, it is sufficient for forming the n-type region 13 on the upper surface of the p-type region 12 as the channel of the select transistor ST1 and, likewise, it is sufficient for forming the n-type region 15 in part or all of the upper surface of the p-type region 14 as the channel of the memory cell MCa which is adjacent to the select transistor ST1.

Figure 11:
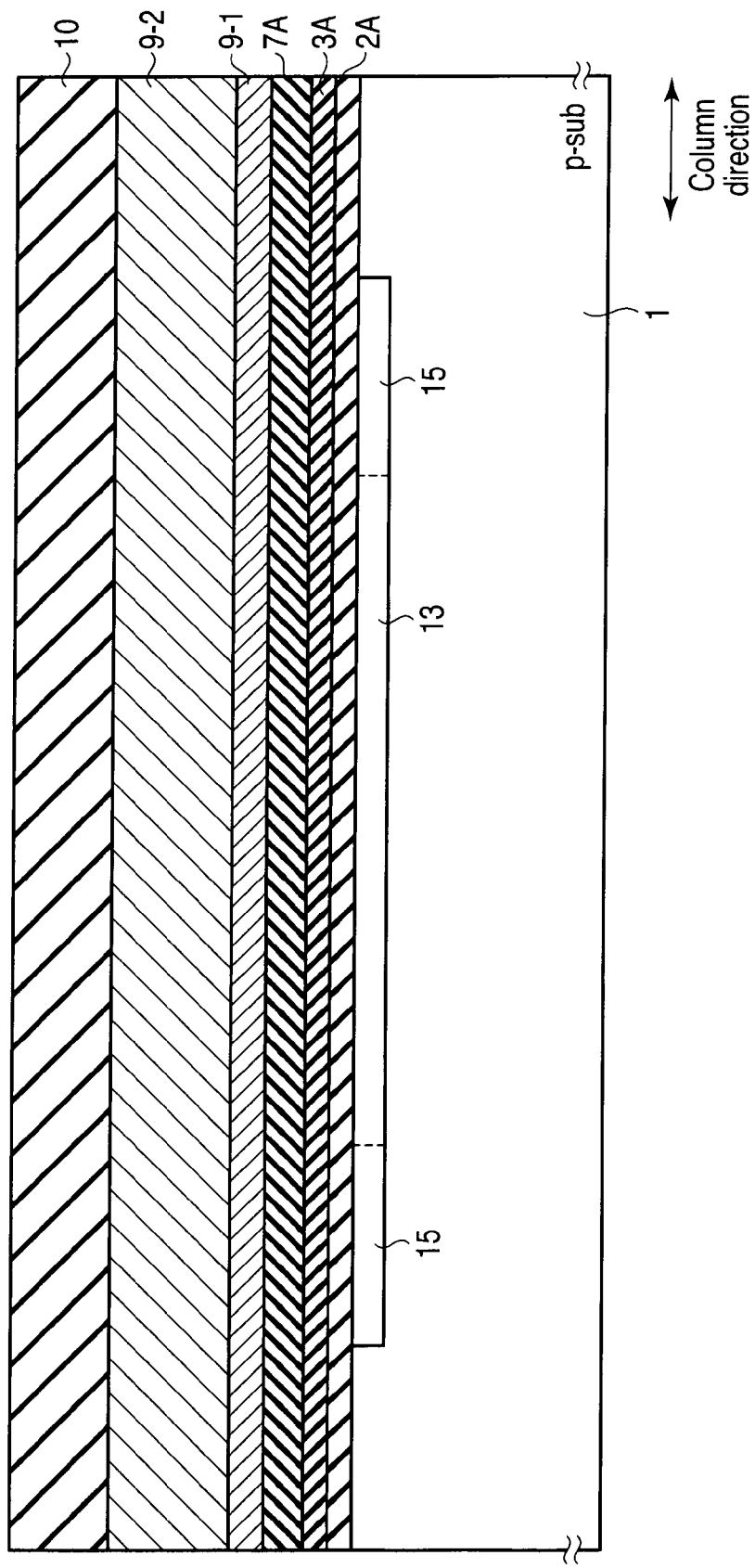

As shown in FIG. 11, a block insulating film material 7A is formed on the charge storage layer material 3A. This block insulating film material 7A is formed of a single-layer structure of a high-dielectric material such as $Al_2O_3$ or HfSiON or a laminated structure including such a material. Subsequently, a gate electrode layer consisting of a laminated film including a TaN film 9-1 and polysilicon 9-2 is formed on the block insulating film 7A. Then, a silicon nitride film 10 as a mask material for gate electrode processing is formed on the gate electrode layer.

Figure 12:
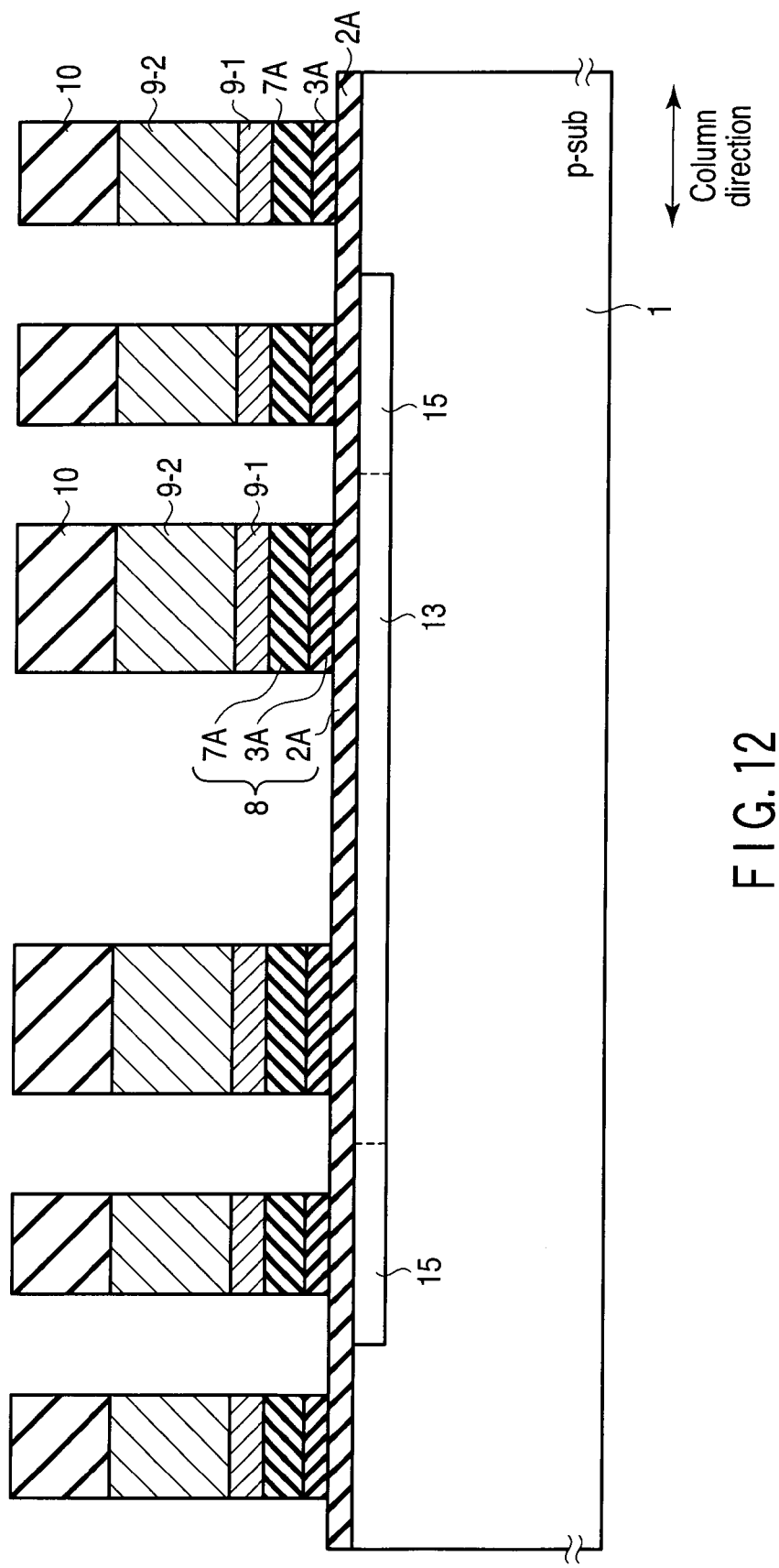

As shown in FIG. 12, the silicon nitride film 10, the polysilicon 9-2, the TaN film 9-1, the block insulating film material 7A, and the charge storage layer material 3A are sequentially etched by lithography method and RIE method.

Figure 13:
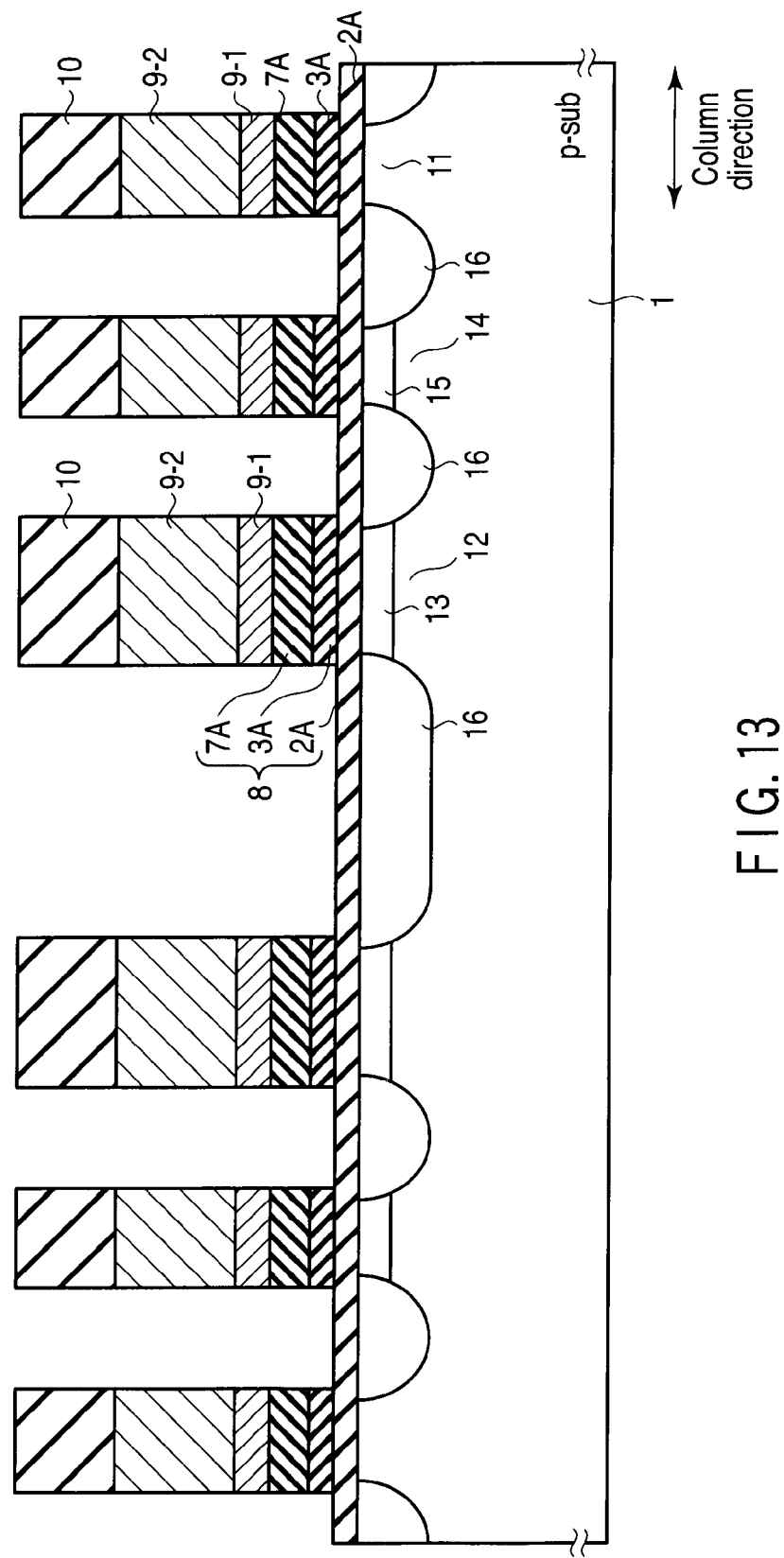

As shown in FIG. 13, n-type source/drain regions 16 of each select transistor ST1 and each memory cell MC are formed near the upper surface of the p-type semiconductor substrate 1 by implantation of impurity ions.

Figure 14:
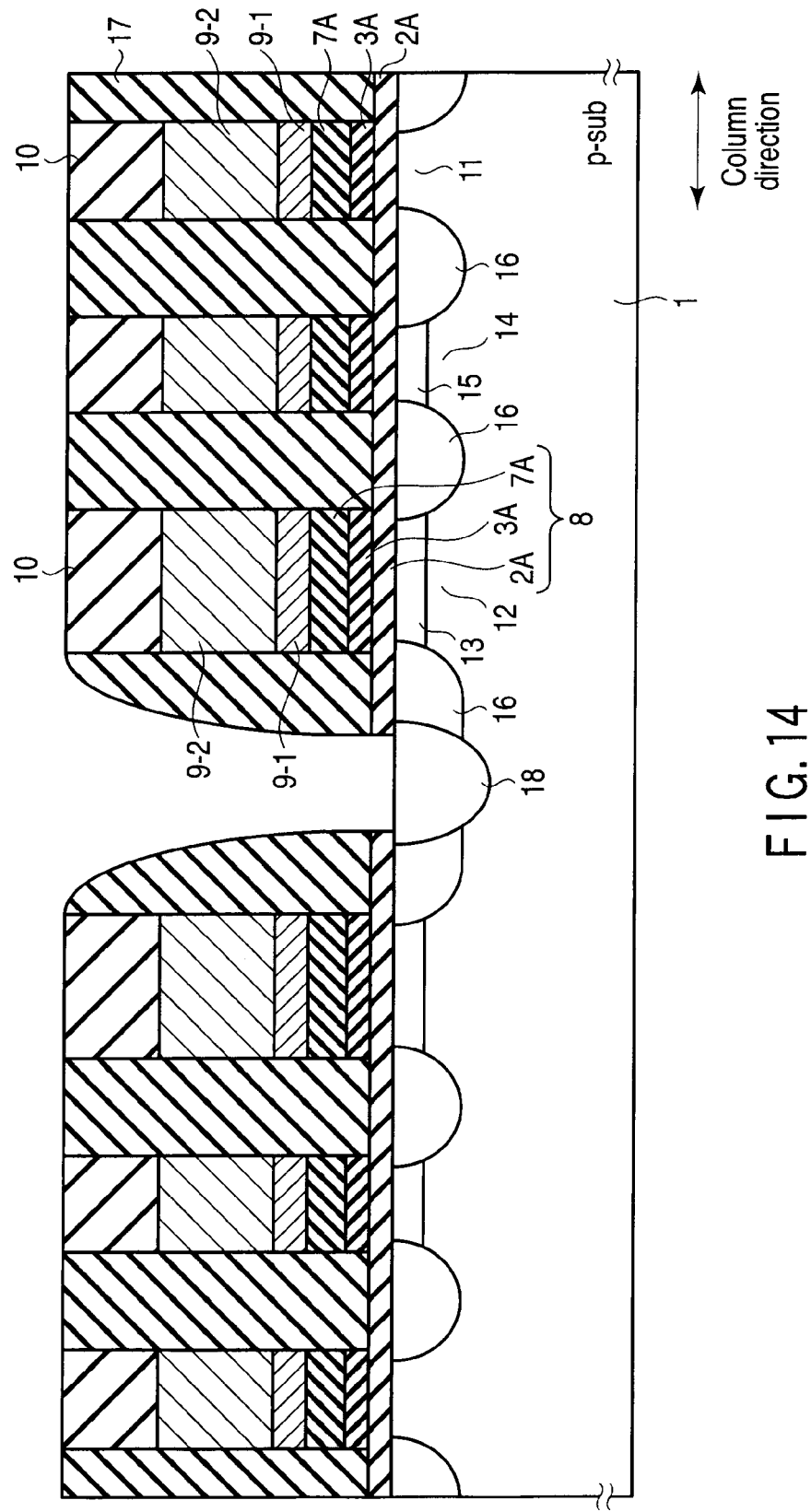

As shown in FIG. 14, an insulating film 17 consisting of, e.g., a silicon oxide film is deposited in such a manner that each space between the memory cells MC and each space between the memory cell MC and the memory cell MCa are filled but each space between the select transistors ST is not filled. Then, the insulating film 17 is formed on a side surface of the select transistor ST close to the space between the select transistors ST by anisotropic RIE. Subsequently, an $n^+$-type diffusion region 18 having a concentration higher than that of the source/drain regions 16 is formed near the upper surface of the p-type semiconductor substrate 1 where a bit line contact and a source line contact are formed.

Figure 15:
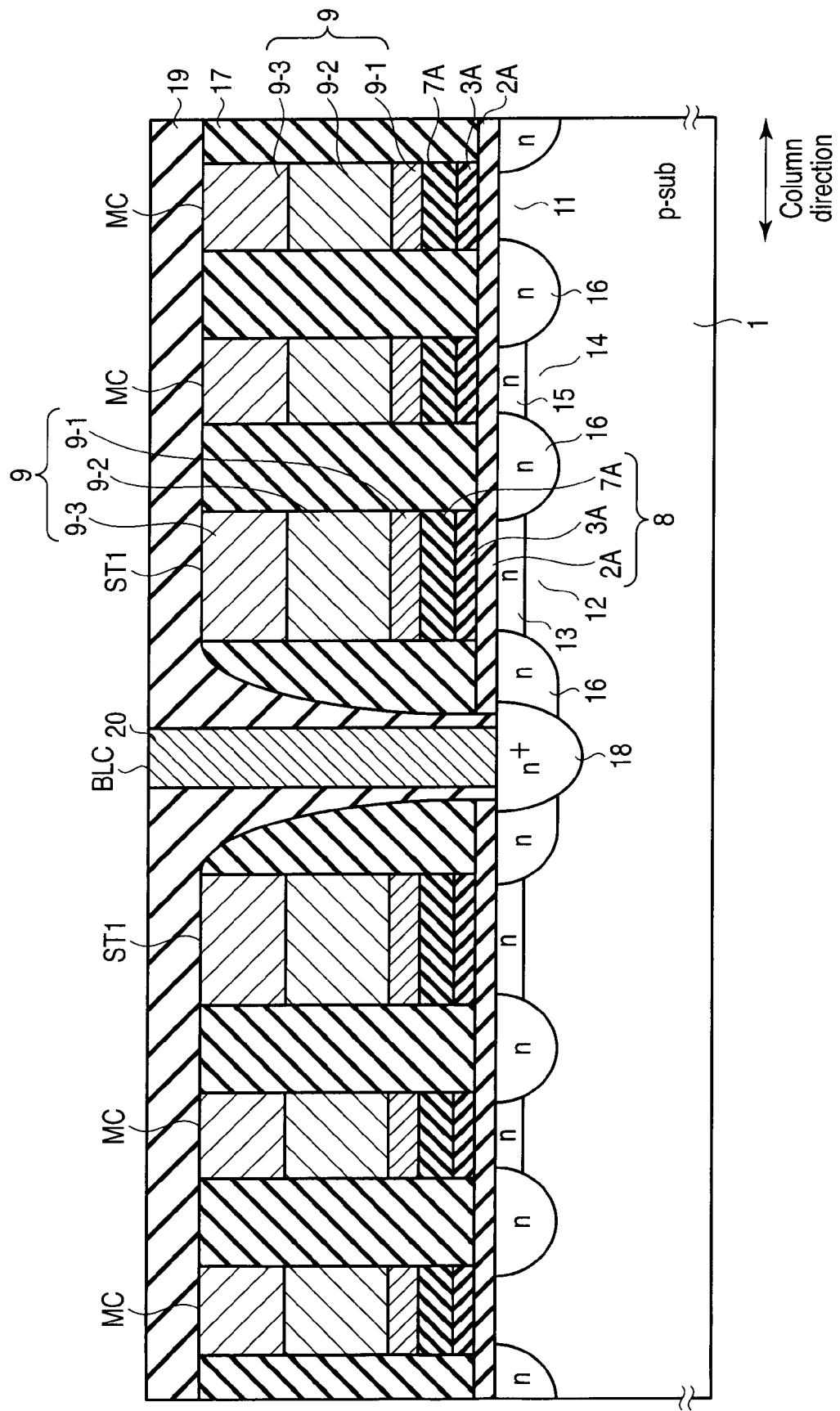

As shown in FIG. 15, the silicon nitride film 10 is removed, and then a CoSi layer 9-3 which serves as a low-resistance third gate electrode layer is formed on an upper surface of the polysilicon 9-2. Then, an insulating film 19 consisting of, e.g., a silicon oxide film is deposited on the entire surface. Subsequently, a bit line contact hole and a source line contact hole are opened in the insulating film 19 based on the lithography, and these holes are filled with, e.g., tungsten. As a result, a contact plug 20 that functions as the bit line contact or the source line contact is formed.

Thereafter, the tunnel insulating film material 2A is turned to a tunnel insulating film 2; the charge storage layer material 3A, a charge storage layer 3; the block insulating film material 7A, a block insulating film 7; and the gate electrode layer having the three-layer structure including the TaN film, the polysilicon, and the CoSi layer, a gate electrode 9. Additionally, an interlayer insulating film is deposited to form an upper wiring layer by using a generally known technique, thereby bringing a nonvolatile semiconductor memory device to completion.

In the embodiment according to the present invention, the memory cell MCa which is adjacent to the select transistor ST1 may be of either the E- or D-type, but the memory cell MC which is not adjacent to the select transistor ST1 may be also of either the E- or D-type.

Further, the impurity concentration of the p-type region 14 may not have to be equal to that of the p-type semiconductor substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate;
   first and second memory cells disposed on the semiconductor substrate in a first direction; and
   an element isolation insulating film disposed between the first and second memory cells in the first direction,
   wherein the first and second memory cells have: first and second tunnel insulating films, respectively, formed on the semiconductor substrate; first and second insulating films which are formed on the first and second tunnel insulating films, respectively; a block insulating film formed on the first and second insulating films; and a first gate electrode formed on the block insulating film, and
   a part of the element isolation insulating film and a part of the block insulating film exist between a side surface of the first insulating film and a side surface of the second insulating film,
   an uppermost surface of the block insulating film on the element isolation insulating film is higher than a lowermost surface of the block insulating film on the first and second insulating films, and
   the side surfaces of the first and second insulating films and the side surfaces of the first and second tunnel insulating films form one continuous plane.

2. The device of claim 1, wherein the first and second insulating films serve as a charge storage layers.

3. The device of claim 1, wherein a film thickness of the block insulating film on the first and second insulating films is smaller than that of the block insulating film on the element isolation insulating film.

4. The device of claim 3, wherein a lowermost bottom surface of the first gate electrode is higher than an upper surface of the first and second insulating films.

5. The device of claim 1, wherein a position of an end of the first insulating film is equal to that of the first tunnel insulating film in the first direction.

6. The device of claim 1, wherein positions of both ends of the first insulating film is equal to those of the first tunnel insulating film in the first direction.

7. The device of claim 1, further comprising a select transistor disposed to the first memory cell in a second direction orthogonal to the first direction, the select transistor having a first gate insulating film formed on the semiconductor substrate and a second gate electrode formed on the first gate insulating film.

8. The device of claim 7, wherein a first channel region is formed in the semiconductor substrate under the first tunnel insulating film, a second channel region is formed in the semiconductor substrate under the first gate insulating film, and at least a part of the first channel region has the same conductivity-type as the second channel region.

9. The device of claim 8, wherein the second channel region has a conductivity-type different from a conductivity-type of the substrate.

10. The device of claim 8, wherein a third channel region is formed in the semiconductor substrate under the second tunnel insulating film, and at least a part of the third channel region has the same conductivity-type as the second channel region.

11. The device of claim 1, wherein the lowermost surface of the block insulating film on the element isolation insulating film is lower than the lowermost surface of the block insulating film on the first and second insulating films.

12. The device of claim 1, wherein the uppermost surface of the block insulating film on the entirety of the element isolation insulating film is higher than a lowermost surface of the block insulating film on the first and second insulating films.

* * * * *